(12) United States Patent
Koste et al.

(10) Patent No.: US 7,633,667 B2
(45) Date of Patent: Dec. 15, 2009

(54) APPARATUS AND METHOD OF FORMING HIGH PERFORMANCE INTEGRATED RF OPTICAL MODULE

(75) Inventors: Glen Peter Koste, Niskayuna, NY (US); Christopher James Kapusta, Delanson, NY (US); Joseph Alfred Iannotti, Glenville, NY (US)

(73) Assignee: General Electric Company, Niskayuna, NY (US)

( * ) Notice: Subject to any disclaimer, the term of this patent is extended or adjusted under 35 U.S.C. 154(b) by 142 days.

(21) Appl. No.: 11/876,070

(22) Filed: Oct. 22, 2007

(65) Prior Publication Data

US 2009/0103160 A1    Apr. 23, 2009

(51) Int. Cl.
*G02F 1/07* (2006.01)
(52) U.S. Cl. ........................ 359/254; 359/245
(58) Field of Classification Search ........... 359/245, 359/252–254; 349/126, 127, 129
See application file for complete search history.

(56) References Cited

U.S. PATENT DOCUMENTS

| 5,353,498 | A  |    | 10/1994 | Fillion et al. |
|-----------|----|----|---------|----------------|
| 5,527,741 | A  |    | 6/1996  | Cole et al. |
| 5,657,537 | A  |    | 8/1997  | Saia et al. |
| 6,560,377 | B2 |    | 5/2003  | Jones et al. |
| 7,068,863 | B2 |    | 6/2006  | Kondo et al. |
| 2003/0042884 | A1 | * | 3/2003 | Kingsley et al. .............. 324/96 |
| 2004/0126050 | A1 |   | 7/2004 | Claydon et al. |
| 2005/0276533 | A1 |   | 12/2005 | Marazzi et al. |
| 2006/0093266 | A1 |   | 5/2006 | Gilardi et al. |
| 2009/0086302 | A1 | * | 4/2009 | Miller et al. ................ 359/245 |

* cited by examiner

*Primary Examiner*—William C Choi
(74) *Attorney, Agent, or Firm*—Penny A. Clarke

(57) ABSTRACT

An integrated electro-optical module apparatus includes in one embodiment an optical modulator configured to modulate an input optical signal coupled thereto; and a control circuit assembly configured to provide electrical control signals to the optical modulator to modulate the input optical signal; wherein the control circuit assembly is attached to the optical modulator in a stacked arrangement.

23 Claims, 5 Drawing Sheets

APPARATUS AND METHOD OF FORMING HIGH PERFORMANCE INTEGRATED RF OPTICAL MODULE

BACKGROUND OF THE INVENTION

The invention relates generally to optical modulator devices and, more particularly, to an apparatus and method of forming a high performance, integrated optical module.

An electro-optic modulator (EOM) is an optical device in which a signal-controlled element exhibiting an electro-optic effect is used to modulate a beam of light. The modulation may be imposed on the phase, frequency, amplitude, or direction of the modulated beam. Optical transmission systems operating on frequencies exceeding 10 gigabits per second (Gb/s) are possible with the use of EOMs. Electro-optic modulators have applications in many types of products including, for example, Magnetic Resonance Imaging (MRI) receive coil arrays, ultrasound probes, and radio frequency transmission systems, to name a few.

One specific type of EOM includes a crystal material, such as lithium niobate ($LiNbO_3$), whose refractive index is a function of the strength of the local electric field. Accordingly, if lithium niobate is exposed to an electric field, light will travel more slowly through the material. Therefore, the phase of the light exiting an EOM may be controlled by changing the electric field in the crystal. An electric field may be generated placing a parallel plate capacitor across the crystal. Since the field inside a parallel plate capacitor depends linearly on the potential, the index of refraction of the crystal generally depends linearly on the field. In turn, since the phase depends linearly on the index of refraction of the crystal, the phase modulation of the light passing through the crystal is controllled by the potential applied to the EOM.

In practical EOM devices, amplitude modulation is more commonly implemented through the use of a Mach-Zehnder (MZ) interferometer, in which a beam splitter divides an input optical signal into two paths (one of which includes a phase modulator as described above), and then recombines the two beams. By changing the electric field on the phase modulating path, it is possible to control whether the two beams constructively or destructively interfere, and thereby to control the amplitude or intensity of the exiting or output light.

$LiNbO_3$ modulators are typically connected to radio frequency (RF) or microwave circuits via external electrical connections (e.g., discrete cable assemblies) between separately packaged lithium niobate and RF circuits. In some cases, RF circuits have been co-packaged with modulators with the various interconnections between parts made using wire bonds. However, RF performance degradations such as loss, reflections, and high frequency amplitude roll off occur most frequently at electrical interfaces between such packaged parts. Accordingly, it would be desirable to be able to implement an improved interface solution between EOMs and RF control circuitry.

BRIEF DESCRIPTION OF THE INVENTION

The above and other drawbacks and deficiencies of the prior art may be overcome or alleviated by an integrated electro-optical module apparatus, including in one embodiment an optical modulator configured to modulate an input optical signal coupled thereto; and a control circuit assembly configured to provide electrical control signals to the optical modulator to modulate the input optical signal; wherein the control circuit assembly is attached to the optical modulator in a stacked arrangement.

In another embodiment, a method of forming an integrated electro-optical module apparatus includes forming a control circuit assembly configured to provide electrical control signals to an optical modulator which modulates an input optical signal thereto; the control circuit assembly including a chip carrier having one or more electrically conductive vias formed therein; and attaching one or more integrated circuit devices to the chip carrier; and attaching the control circuit assembly to the optical modulator such that the control circuit assembly and the optical modulator are configured in a stacked arrangement.

In still another embodiment, an integrated electro-optical module system includes a lithium niobate ($LiNbO_3$) optical modulator; an input optical source in optical communication with the optical modulator; and a control circuit assembly configured to provide electrical control signals to the optical modulator to modulate an input optical signal generated the input optical source, the control circuit assembly further comprising a chip carrier having one or more electrically conductive vias formed therein and one or more integrated circuit devices attached to the chip carrier; wherein the control circuit assembly is attached to the optical modulator in a stacked arrangement.

These and other advantages and features will be more readily understood from the following detailed description of preferred embodiments of the invention that is provided in connection with the accompanying drawings.

DETAILED DESCRIPTION OF THE INVENTION

Disclosed herein is apparatus and method of forming a high performance, integrated electro-optical module. Traditionally, RF performance degradations (e.g., loss, reflections and high frequency amplitude roll off) occur most frequently at electrical interfaces between packaged parts. Accordingly, by integrating the control circuitry directly on the optical modulator in a single package, the RF interconnects to the optical modulator electrodes are optimized for broadband high frequency performance.

The exemplary embodiments described herein are applicable to any type of optical modulator, including, for example, silicon photonics (manufactured with CMOS processes) by Luxtera Corporation, or polymer modulators. However, in one particularly suitable embodiment, lithium niobate optical modulator technology offers the superior photonic performance when integrated with RF chip-on flex technology. More specifically, a flexible chip carrier with RF circuitry is laminated (in one embodiment) to a lithium niobate modulator chip, wherein vias formed within the flexible chip carriers couples RF output signals to the traveling wave electrodes included on the lithium niobate. Thereby, an integrated RF optical module is formed, characterized by the RF circuitry and optical modulator attached to one another in a stacked arrangement. In another general embodiment, a lithium niobate modulator chip may be "flipchip" attached to an integrated RF assembly so as to result in a high density, low parasitic electro-optic microwave modulator.

Figure 1:
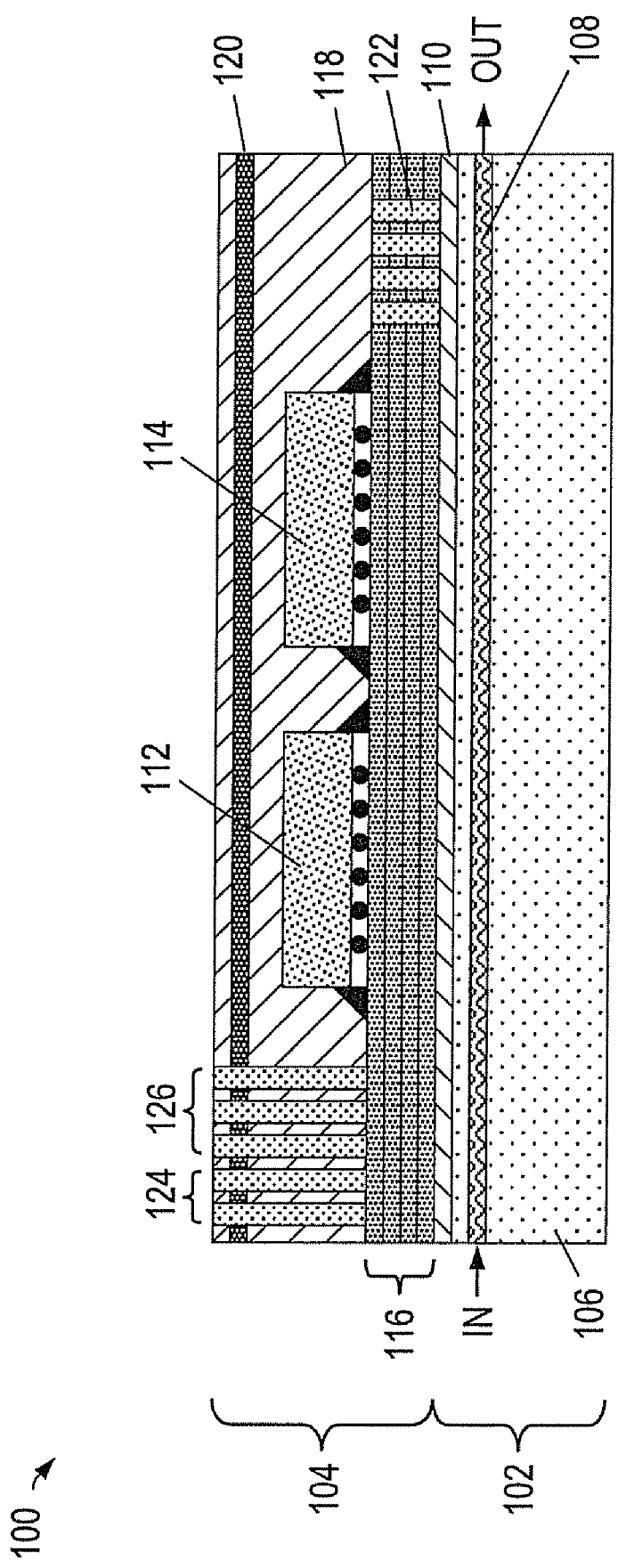
FIG. 1 is a schematic diagram of an integrated RF optical module apparatus, in accordance with an exemplary embodiment of the invention.

Referring initially to FIG. 1, there is shown a schematic diagram of an integrated RF optical module apparatus 100, in accordance with an exemplary embodiment of the invention. The apparatus 100 generally includes an optical modulator 102 (e.g., MZ interferometer) attached to an RF (for example) control circuit assembly 104 in a stacked arrangement (e.g., formed by sequential laminations of chip carrier layers on top of the optical modulator 102). The optical modulator 102 further includes, in addition to substrate 106, an optical waveguide 108 and electrode 110. The waveguide 108 receives a constant amplitude optical input signal at one end thereof (IN) and outputs an RF modulated optical output signal at the other end thereof (OUT).

The RF circuit assembly 104 includes one more RF integrated circuit devices, such as built in test (BIT) power and DC bias chip 112 and low noise RF amplifier chip 114, mounted to a multiple layer, flexible chip carrier 116 by solder bump connection, for example. The chip carrier 116 may comprise, in an exemplary embodiment, a material such as Kapton®, a polyimide film manufactured by DuPont. Alternatively, a liquid crystal polymer material could also be used to form the individual laminations of chip carrier 116 (or any other multilayer circuit material know to those skilled in the art). As further illustrated in FIG. 1, chips 112 and 114 are encased within an overmold material 118, which may include a heat spreader formed therein. For signal routing, high performance RF vias 122 are used to communicate output RF control signals from the RF circuitry to the electrode 110 of the optical modulator 102. Additional vias (not specifically shown in FIG. 1), are formed within the layers of the chip carrier 116 to facilitate electrical interconnection between chips 112, 114, as well as between chips 112, 114 and externally provided RF input signals (vias 124) and power connections (vias 126).

In the embodiment of FIG. 1, the flexible chip carrier 116 is laminated (sequentially, if multiple layers are used) directly to the optical modulator 102, such as through a suitable adhesive. The flexible chip carrier 116 is manufactured with electrical traces and vias (not shown) to electrically interconnect the optical modulator 102, through high performance RF vias 122, to the RF chips 112, 114 and externally provided RF input signals (vias 124) and power connections (vias 126). Once the chip carrier 116 is built upon the optical modulator 102, the RF chips 112, 114 may be attached to the opposite side of the chip carrier 116, followed by overmold 118 (and heat spreader 120) formation. From a thermal perspective, an optical modulator material such as lithium niobate has a compatible coefficient of thermal expansion (CTE) with respect to a chip carrier material such as Kapton. For example, lithium niobate has a CTE of $15.4 \times 10^{-6}/°$ C. parallel to the optic or C-axis in a temperature range from 0° C. to 110° C., and $7.5 \times 10^{-6}/°$ C. perpendicular to the C-axis in a temperature range from 0° C. to 110° C. In comparison, Kapton® E polyimide film has a CTE of $16 \times 10^{-6}/°$ C.

Figure 2:
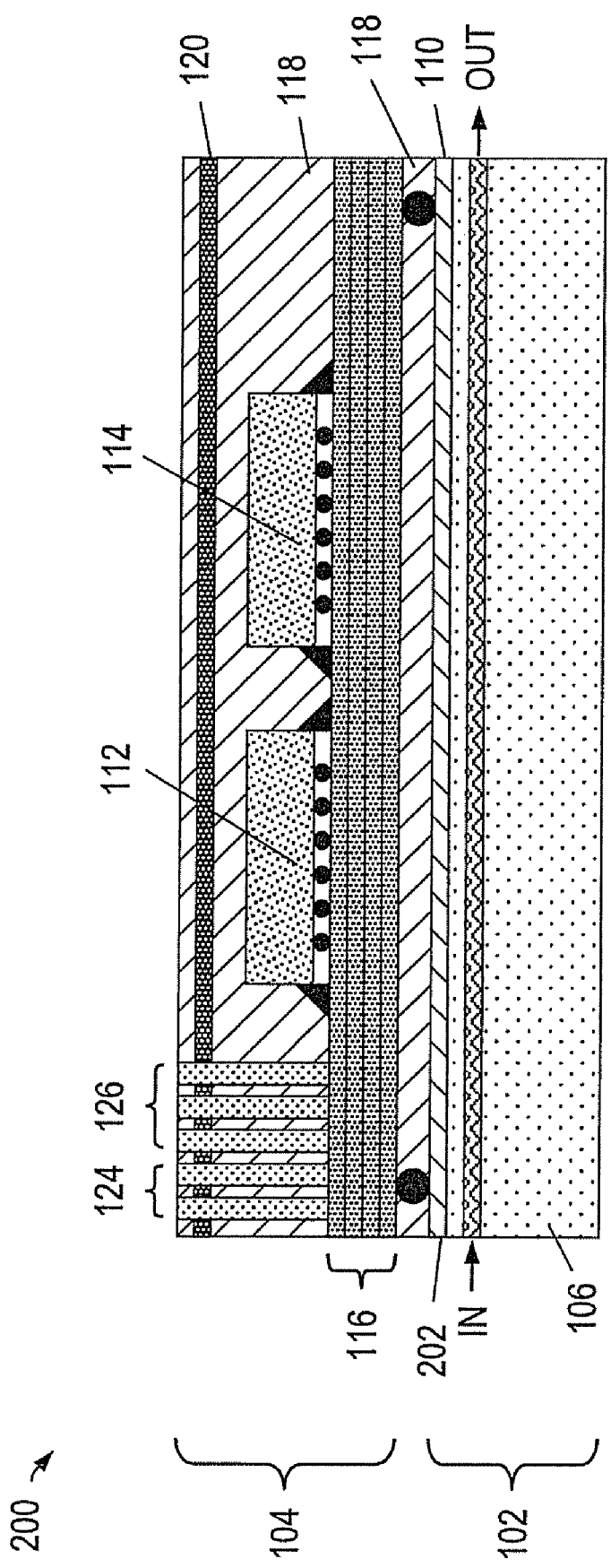
FIG. 2 is a schematic diagram of an integrated RF optical module apparatus, in accordance with another exemplary embodiment of the invention.

FIG. 2 illustrates an alternative embodiment of FIG. 1, in which the integrated RF optical module apparatus 200 is formed by a flipchip attachment of the optical modulator 102 to the RF circuit assembly 104. In particular, FIG. 2 illustrates solder (for example) ball connections 202 between the optical modulator 102 and the RF circuit assembly 104, with an additional amount of overmold material 118 used to fill the gaps therebetween.

Figure 3:
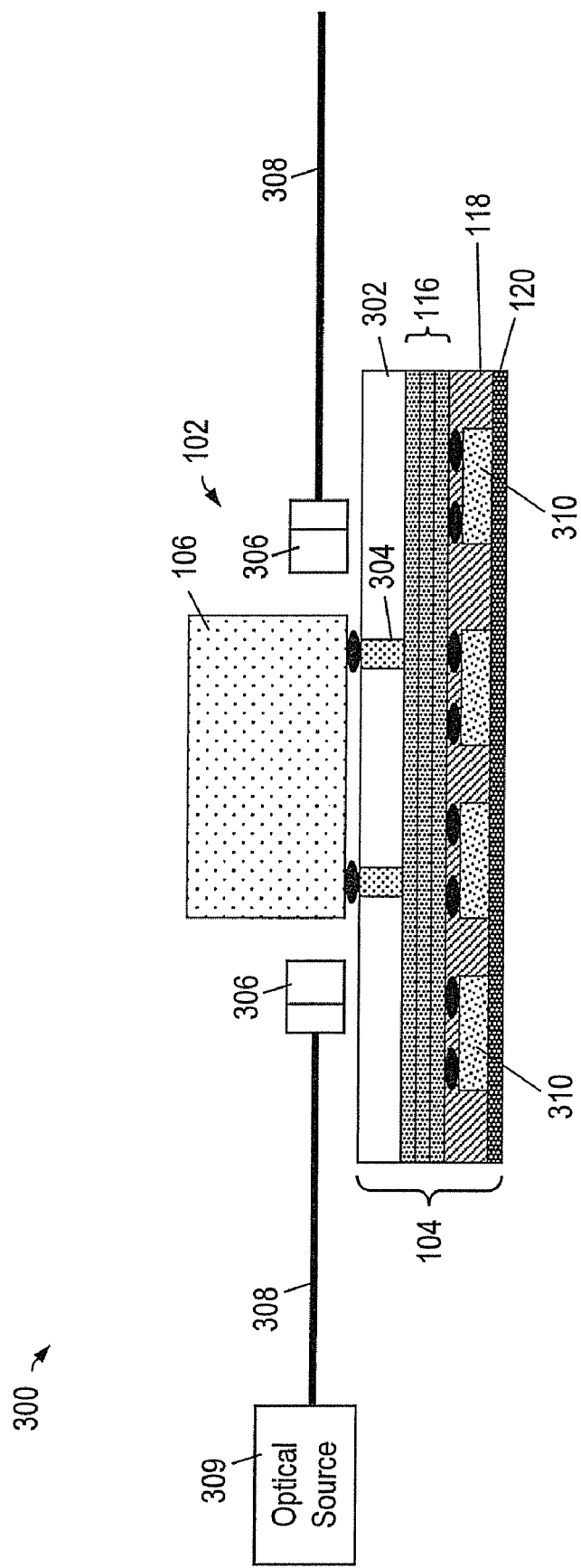
FIG. 3 is a schematic diagram of an integrated RF optical module apparatus, in accordance with another exemplary embodiment of the invention.
Figure 4:
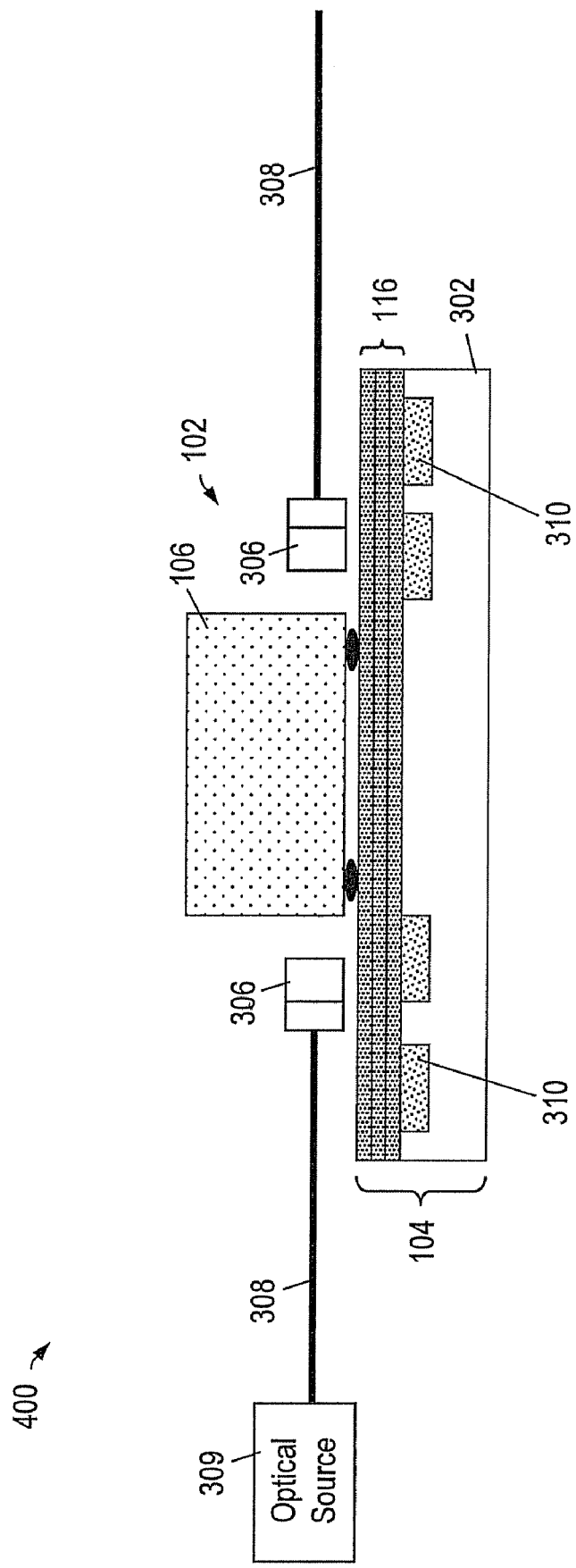
FIG. 4 is a schematic diagram of an integrated RF optical module apparatus, in accordance with another exemplary embodiment of the invention.
Figure 5:
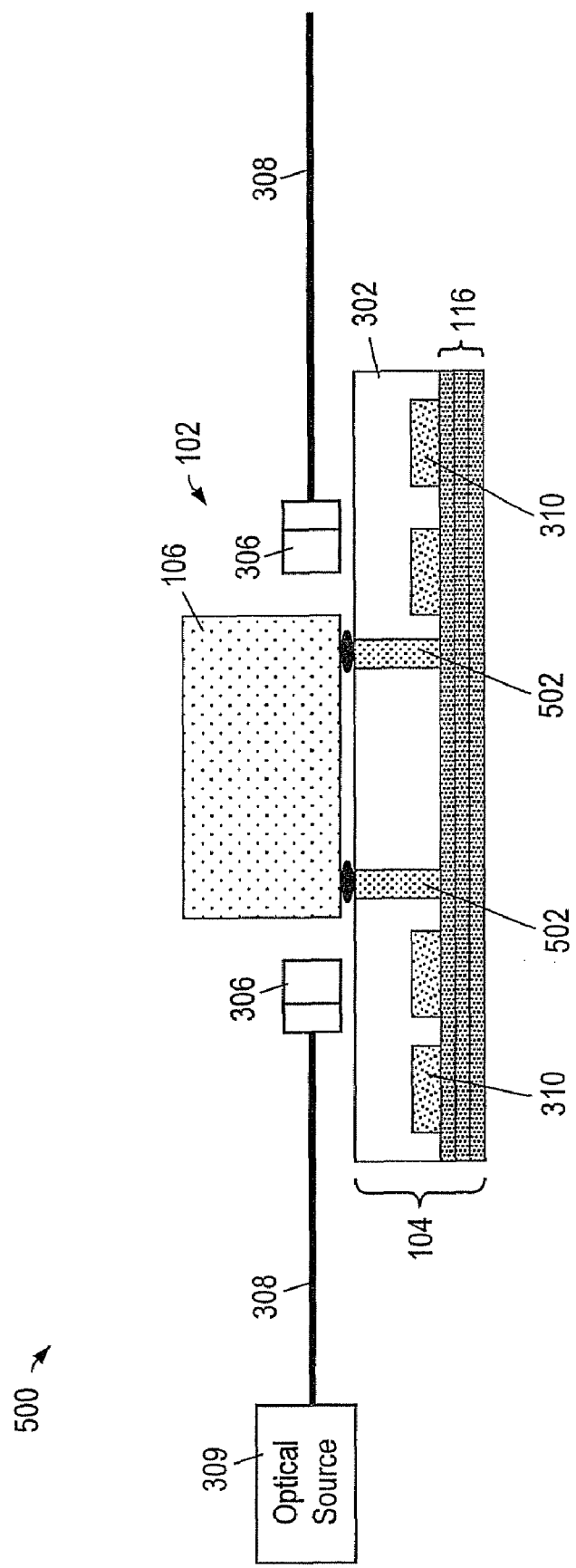
FIG. 5 is a schematic diagram of an integrated RF optical module apparatus, in accordance with another exemplary embodiment of the invention.

Referring generally to FIGS. 3 through 5, there are illustrated various additional packaging embodiments where an RF circuit is flipchip attached to a lithium niobate modulator in a stacked arrangement, wherein the RF circuit assembly includes both a Kapton material chip carrier and an alumina ($Al_2O_3$) ceramic substrate. Again, a suitable alternative to a Kapton chip carrier would be to use liquid crystal polymer material. Flipchip bumps of solder, gold, or other electrically conductive materials are also used.

In the specific embodiment illustrated in FIG. 3, the integrated RF optical module apparatus 300 includes a rigid substrate 302 (e.g., $Al_2O_3$, plastic, FR4) as part of the RF circuit assembly 104. Through vias 304 are formed within the rigid substrate 302, which is attached at one side thereof to the multilayer chip carrier 116. The other side of the rigid substrate 302 is flipchip bonded to the optical modulator 102, which in this embodiment also depicts (in addition to substrate 106) input/output optical lenses 306 and fibers 308 in optical signal communication with the optical modulator (e.g., MZ interferometer), as well as an input optical source 309 (e.g., a laser). Then, the side of the chip carrier 116 not attached to the rigid substrate 302 is configured with the various RF integrated circuit (IC) chips or monolithic microwave ICs (MMICs) 308 attached thereto (e.g., solder flip chip, gold stud bump, etc.). The MMICs 310 are then protected through an overmold layer 118 and optional heat spreader device 120.

In still another embodiment as illustrated in FIG. 4, the MMICs 310 are first configured within the rigid substrate 302, which includes chip wells with depths corresponding to the approximate thickness of the corresponding MMICs 310. The chip wells may be fabricated by any suitable processes, including mechanical machining after the substrate 302 is co-fired and punching out selected areas in a top ceramic tape layer (not shown) prior to co-firing the substrate 302. In one embodiment, the MMICs 310 may be attached to the substrate 302 with an adhesive layer (not shown). Then, the chip carrier 116 is applied to the rigid substrate 302 and MMICs 310 using any suitable high-density interconnect (HDI) overlay process, including the formation of metallization and interconnects within the chip carrier 116. Upon completion of the RF circuit assembly 104, the optical modulator 102 is then flipchip attached to the RF circuit assembly 104, thereby forming an integrated RF optical module apparatus 400.

Finally, FIG. 5 illustrates an integrated RF optical module apparatus 500, in accordance with still another embodiment of the invention. The embodiment of FIG. 5 is similar to that of FIG. 4, in that the MMICs 310 are first configured within the rigid substrate 302, followed by attachment of the multi layer RF circuitry 116 is applied to the rigid substrate 302 and MMICs 310 using an HDI overlay process to define the RF circuit assembly 104. However, rather than flipchip attaching the optical modulator 102 to the opposite side of the chip carrier 116 with respect to the MMICs 310 (as done in FIG. 4), the optical modulator 102 is instead attached to the rigid substrate 302. In order to facilitate RF signal connection between the MMICs 310 (through using chip carrier 116) and the optical modulator 102, one or more vias 502 are formed through the thickness of the rigid substrate 302. Stated another way, both the MMICs 310 and the optical modulator 102 are electrically coupled to the same side of the chip carrier 116.

Thus configured, the integrated RF optical module embodiments described herein provide competitive advantages over traditional interconnect solutions including, for example, performance, size, and cost. In particular, device performance improvements are realized due to a reduction of loss and reflections at interfaces as previously described. In addition, size is reduced since the RF circuit and optical modulator are packaged in the same footprint area in a stacked configuration, thereby eliminating the need for separate components. Furthermore, cost advantages also result, since the use of RF devices on flex circuits result in better repeatability and eliminate the need for tuning of the circuit during or after manufacture.

While the invention has been described with reference to exemplary embodiments, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment disclosed as the best mode contemplated for carrying out this invention, but that the invention will include all embodiments falling within the scope of the appended claims.

The invention claimed is:

1. An integrated electro-optical module apparatus, comprising:
    an optical modulator configured to modulate an input optical signal coupled thereto; and
    a control circuit assembly configured to provide electrical control signals to the optical modulator to modulate the input optical signal;
    wherein the control circuit assembly is attached to the optical modulator in a stacked arrangement, and wherein the control circuit assembly further comprises:
    a chip carrier having one or more electrically conductive vias formed therein; and
    one or more integrated circuit devices attached to the chip carrier.

2. The apparatus of claim 1, wherein the optical modulator comprises lithium niobate ($LiNbO_3$).

3. The apparatus of claim 1, wherein the chip carrier comprises a flexible, multiple layer polyimide film.

4. The apparatus of claim 1, wherein the chip carrier comprises a liquid crystal polymer material.

5. The apparatus of claim 1, wherein the control circuit assembly is flipchip attached to the optical modulator.

6. The apparatus of claim 5, wherein the control circuit assembly further comprises a rigid substrate attached to the chip carrier.

7. The apparatus of claim 6, wherein the rigid substrate comprises alumina ($Al_2O_3$).

8. The apparatus of claim 6, wherein the rigid substrate and the one or more integrated circuit devices are attached to opposite sides of the chip carrier.

9. The apparatus of claim 8, wherein:
    the rigid substrate is flipchip attached to the optical modulator; and
    the rigid substrate further comprises one or more vias formed therethrough so as to facilitate electrical communication between the chip carrier and the optical modulator.

10. The apparatus of claim 6, wherein the rigid substrate and the one or more integrated circuit devices are attached to the same side of the chip carrier, the rigid substrate covering the one or more integrated circuit devices.

11. The apparatus of claim 10, wherein the chip carrier is flipchip attached to the optical modulator.

12. The apparatus of claim 10, wherein:
    the rigid substrate is flipchip attached to the optical modulator; and
    the rigid substrate further comprises one or more vias formed therethrough so as to facilitate electrical communication between the chip carrier and the optical modulator.

13. A method of forming an integrated electro-optical module apparatus, the method comprising:
    forming a control circuit assembly configured to provide electrical control signals to an optical modulator which modulates an input optical signal thereto;
    the control circuit assembly including a chip carrier having one or more electrically conductive vias formed therein; and
    attaching one or more integrated circuit devices to the chip carrier; and
    attaching the control circuit assembly to the optical modulator such that the control circuit assembly and the optical modulator are configured in a stacked arrangement.

14. The method of claim 13, wherein the chip carrier comprises a flexible, multiple layer polyimide film.

15. The method of claim 14, wherein the optical modulator comprises lithium niobate ($LiNbO_3$).

16. The method of claim 13, further comprising flipchip attaching the control circuit assembly to the optical modulator.

17. The method of claim 16, further comprising attaching a rigid substrate to the chip carrier.

18. The apparatus of claim 17, wherein the rigid substrate comprises alumina ($Al_2O_3$).

19. The method of claim 17, wherein the rigid substrate and the one or more integrated circuit devices are attached to opposite sides of the chip carrier.

20. The method of claim 19, further comprising:
    flipchip attaching the rigid substrate to the optical modulator; and
    wherein the rigid substrate further comprises one or more vias formed therethrough so as to facilitate electrical communication between the chip carrier and the optical modulator.

21. The method of claim 17, wherein the rigid substrate and the one or more integrated circuit devices are attached to the same side of the chip carrier, the rigid substrate covering the one or more integrated circuit devices.

22. The method of claim 21, wherein the chip carrier is flipchip attached to the optical modulator.

23. The method of claim 21, further comprising:
    flipchip attaching the rigid substrate to the optical modulator; and
    wherein the rigid substrate further comprises one or more vias formed therethrough so as to facilitate electrical communication between the chip carrier and the optical modulator.

* * * * *